United States Patent [19]
Labrie

[11] Patent Number: 6,051,064
[45] Date of Patent: Apr. 18, 2000

[54] APPARATUS FOR WEIGHING CRYSTALS DURING CZOCHRALSKI CRYSTAL GROWING

[75] Inventor: Aaron L. Labrie, Vancouver, Wash.

[73] Assignee: SEH America, Inc., Vancouver, Wash.

[21] Appl. No.: 09/137,409

[22] Filed: Aug. 20, 1998

[51] Int. Cl.[7] .................................................. C30B 35/00
[52] U.S. Cl. ....................... 117/208; 117/201; 117/202; 117/217; 117/218
[58] Field of Search .................................. 117/201, 202, 117/208, 217, 218, 900, 911

[56] References Cited

U.S. PATENT DOCUMENTS

| | | |
|---|---|---|
| 3,934,983 | 1/1976 | Bardsley et al. . |
| 4,008,387 | 2/1977 | Green et al. . |
| 4,032,389 | 6/1977 | Joyce . |
| 4,073,355 | 2/1978 | Schmidt et al. . |
| 4,258,003 | 3/1981 | Hurle et al. . |
| 4,397,813 | 8/1983 | Washizuka et al. . |
| 4,565,598 | 1/1986 | Seymour . |
| 4,586,979 | 5/1986 | Katsumata et al. . |
| 4,591,994 | 5/1986 | Washizuka et al. . |
| 4,916,955 | 4/1990 | Katsuoka et al. ..................... 73/862.54 |
| 5,074,953 | 12/1991 | Shirata et al. . |
| 5,091,043 | 2/1992 | Shirata et al. . |
| 5,660,629 | 8/1997 | Shiraishi et al. . |
| 5,725,660 | 3/1998 | Hiraishi ................................. 117/201 |
| 5,879,451 | 3/1999 | Mizuishi ................................. 107/208 |

OTHER PUBLICATIONS

A. E. Zinnes et al., "Automatic Diameter Control of Czochralski Grown Crystals", *Journal of Crystal Growth*, vol. 19, (1973), pp. 187–192.

W. Bardsley et al., "The Weighing Method of Automatic Czochralski Crystal Growth", *Journal of Crystal Growth*, vol. 40, (1977); pp. 21–28.

A. J. Valentino et al., "Diameter Control of Czochralski Grown Crystals", *Journal of Crystal Growth*, vol. 26, (1974), pp. 1–5.

T. Satoh et al., Automatic Control System for Czochralski Growth of Large Diameter $LiNbO_3$ Crystals, *Fujitsu Scientific & Technical Journal*, Mar. 1976, pp. 93–113.

H. J.A. van Dijk et al., "Crystal Diameter Control in Czochralski Growth", *Acta Electronica*, vol. 17, 1, 1974, pp. 45–55.

T. H. Johansen, "The Weight Gain Signal in Czochralski Crystal Growth", *Journal of Crystal Growth*, vol. 118, (1992) pp. 353–359.

P. Sveshtarov et al., "The Melt Level Technique of Automatic Czochralski Crystal Growth; Basic Theory and Comparison With the Weighing Method", *Journal of Crystal Growth*, vol. 118, (1992), pp. 439–451.

*Primary Examiner*—Felisa Hiteshew
*Attorney, Agent, or Firm*—Oliff & Berridge, PLC

[57] ABSTRACT

An apparatus for weighing single crystals during Czochralski crystal growing processes includes a pivotal elongated member such as a beam, a contact element and a load sensor. The load sensor can be mounted to at least one of the elongated member and a support surface of a crystal growing vessel. The beam is attached to a lift for pulling single crystals from a melt. During crystal growing, the weight of the grown crystal causes increased loading along the elongated member such that the contact element exerts an increasing force on the load sensor. The contact element and load sensor have respective contact surfaces which are shaped such that the force exerted on the load sensor corresponds substantially to the weight of grown single crystal. Typically, at least one of the contact surfaces is a rolling surface.

23 Claims, 6 Drawing Sheets

APPARATUS FOR WEIGHING CRYSTALS DURING CZOCHRALSKI CRYSTAL GROWING

BACKGROUND OF THE INVENTION

1. Field of Invention

This invention is directed to the field of semiconductor crystal growing and, more particularly, to an apparatus for weighing crystals during Czochralski crystal growing processes.

2. Description of Related Art

The Czochralski crystal growing technique is commonly used to commercially grow bulk semiconductor single crystals such as silicon crystals. In this technique, molten semiconductor material is contained in a crucible in a chamber of a crystal growing apparatus under controlled temperature and pressure conditions. A seed crystal is lowered into contact with the melt and then slowly raised to pull a single crystal from the melt. Typically, the single crystal is rotated during pulling. The grown single crystal includes neck, shoulder, body and tail portions formed in this respective order. The body is used to produce semiconductor wafers.

The body portion of single crystals is required to be of uniform high quality. To achieve such high quality, it is necessary to accurately control the diameter of the body portion during crystal growth to enable the homogeneity of the grown crystal to be accurately controlled. The concentration of deliberately added impurities and stoichiometry are sensitive to growth rate fluctuations. It is desirable to have a uniform cross-section along the length of the body portion of the crystal to provide maximum volume of crystal for subsequent slicing operations to form wafers.

In addition to properly forming the body portion of single crystals, it is also important to properly form the tail portion in order to produce body portions of high quality and sufficient length, and also to efficiently utilize semiconductor material. Known methods of Czochralski crystal growth include weighing methods that measure the weight of grown crystal to determine the completion time of the body portion and, accordingly, the time at which to start forming the tail portion which is adjacent to the body portion and the lowermost portion of the single crystal. To form the tail portion, the pulling rate of the single crystal and/or the temperature of the melt are varied to gradually decrease the single crystal diameter so that the tail portion has a tapered configuration. The tail portion typically has a generally conical shape.

As stated, in order to form the tail portion, the pulling rate and the melt temperature are adjusted at a selected time during crystal growing. It is important that the formation of the tail portion be started at the correct time, and not too early or too late in the crystal growing process. If the tail portion is started too early, although the tail portion may be properly formed, there may be an excessive amount of residual melt in the crucible when the tail portion is completed. This residual melt is expensive waste material due to the high cost of semiconductor material. In addition, the excessive residual melt does not go into forming the body portion of the single crystal, and, consequently, the body portion may be undersized. As a result, the number of wafers that can be formed from the body portion is reduced.

If, on the other hand, the formation of the tail portion is started too late during the crystal growing process, then the tail portion may not be fully formed. In such instances, the entire amount of melt in the crucible goes into the crystal before the tail portion is completed. As a result, it is typically necessary to remove more than a desired volume of material from the lower part of the body portion adjacent to the tail portion to remove crystal that tends to have poor crystal structure and, consequently, also poor electrical properties. Thus, starting the formation of the tail portion too late during crystal growing also causes waste of semiconductor material and a reduction in the number of wafers that can be formed from single crystals.

Known apparatuses for weighing single crystals during Czochralski crystal growing processes do not provide sufficiently accurate measurements of crystal weight to enable the completion of the formation of the body portion to be accurately determined. Particularly, these apparatuses can give weight measurements of grown crystal that vary depending on pressure and temperature conditions present in the crystal growing vessels. Consequently, tail portions tend to be started either too early or too late during the crystal growing process because the completion of formation of the body portion is not accurately determined, resulting in the above-described problems.

Thus, there is a need for an apparatus that can accurately weigh grown single crystals during Czochralski crystal growing processes to enable the production of properly formed single crystals.

SUMMARY OF THE INVENTION

This invention provides an apparatus for weighing Czochralski single crystals during crystal growth in crystal growing vessels that satisfies the above need. The apparatus can be used to weigh single crystals during crystal growth from melts of semiconductor materials having different compositions. The apparatus can provide accurate determination of the progress of crystal formation, such that the different portions of single crystals can be properly formed and semiconductor material can be efficiently utilized.

The apparatus can be used to accurately determine the completion of formation of the body portion and the proper time in the crystal growing process to begin formation of the tail portion. Accordingly, the body and tail portions can both be properly formed. Consequently, the problems associated with improperly formed tail portions can be reduced, thereby more efficiently utilizing semiconductor material by reducing waste of formed single crystal material and residual melt material.

The apparatus for weighing Czochralski single crystals during crystal growth can be used in crystal growing vessels including a chamber, a crucible containing a melt of a semiconductor material in the chamber, and a lift for raising a seed crystal in contact with the melt to pull a single crystal. The apparatus comprises an elongated member having a first end and an opposed second end. The elongated member is attached to the lift between the first and second ends. The elongated member includes a first contact surface. The apparatus comprises a second contact surface, and a load sensor operatively associated with at least one of the first and second contact surfaces. The elongated member deflects during pulling of single crystals from the melt, such that the first contact surface exerts a force on the second contact surface.

According to an aspect of this invention, the force exerted by the first contact surface on the second contact surface corresponds substantially to the weight of the single crystal grown during pulling. Accordingly, the load sensor can accurately determine grown single crystal weight. To achieve this aspect, the apparatus can comprise a rolling element mounted to either the elongated member or the load sensor, which rolls substantially unconstrained on a contact surface of the other of the elongated member or the load sensor during crystal growth. This rolling contact can reduce forces on the load sensor that can prevent accurate determinations of crystal weight in known crystal weighing apparatuses.

To further reduce such forces between the contact surfaces, the contact surfaces can be smooth, and lubricants can be used, to reduce friction between the contact surfaces.

The apparatus according to embodiments of this invention can provide accurate measurements of crystal weight for different pressure and temperature conditions in crystal growing vessels, including vacuum pressures. The apparatus can provide improved utilization of semiconductor materials and properly configured single crystals.

BRIEF DESCRIPTION OF THE DRAWINGS

Certain preferred embodiments of this invention will be described in detail, with reference to the following figures, in which.

DETAILED DESCRIPTION OF PREFERRED EMBODIMENTS

Figure 1:
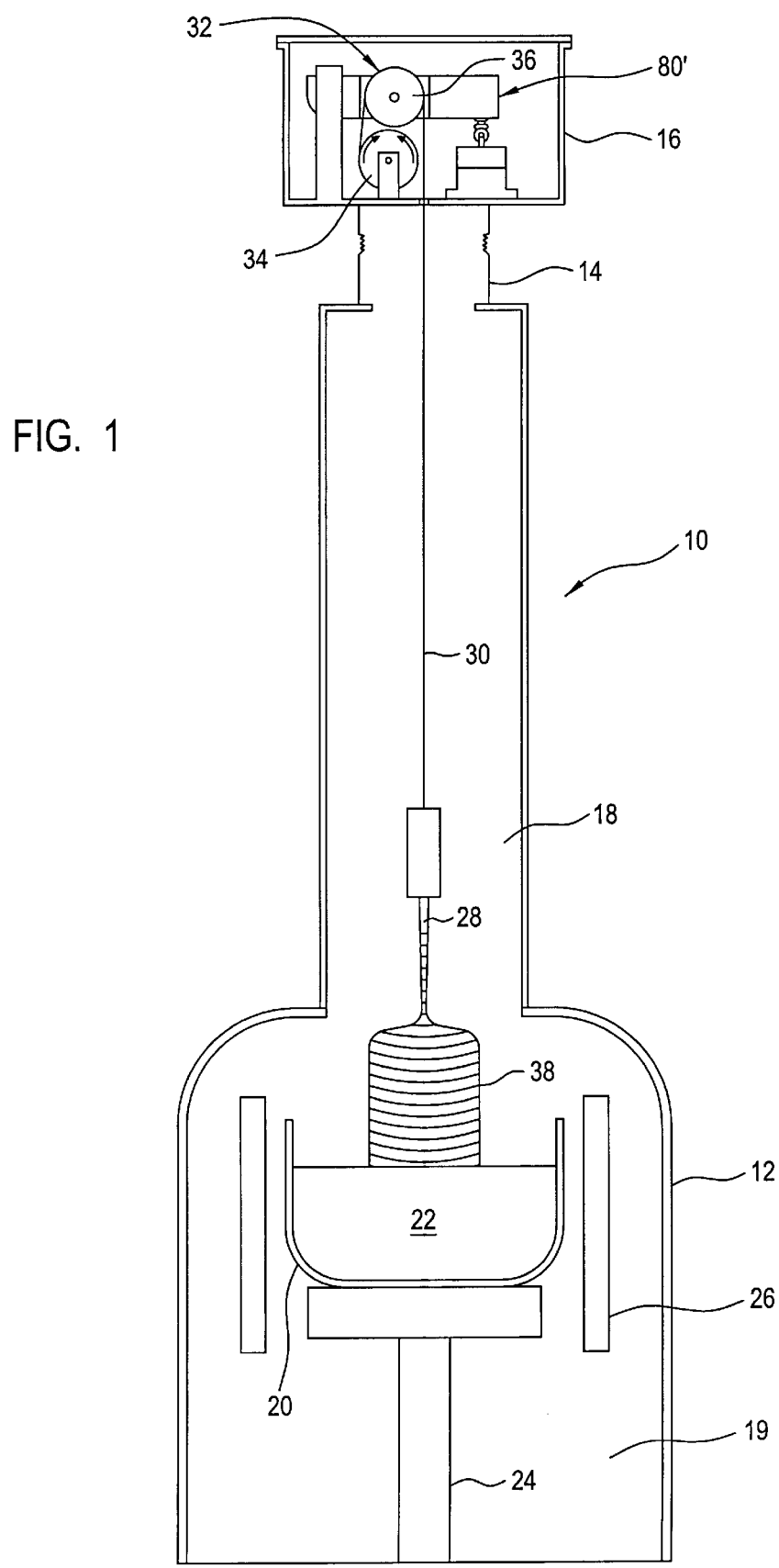
FIG. 1 is an elevational view of a single crystal growing vessel for growing Czochralski single crystals including an apparatus for weighing Czochralski single crystals during crystal growth according to an embodiment of this invention.

FIG. 1 illustrates a single crystal growing vessel for growing Czochralski single crystals by the Czochralski growing technique. The single crystal growing vessel 10 comprises a lower section 12, an intermediate bellows section 14, and an upper section 16.

The lower section 12 of the single crystal growing vessel 10 includes a pull chamber 18 and a lower chamber 19 housing a crucible 20 containing molten semiconductor material (melt) 22. The crucible 20 is supported on a base 24 and surrounded by a heater 26 to control the melt temperature. A seed crystal 28 is suspended from a seed cable 30 in the pull chamber 18. The seed crystal 28 is raised and lowered in the pull chamber relative to the melt 22. Typically, the seed cable 30 is raised and lowered by operation of a lift 32 disposed in the upper section 16. The illustrated lift 32 includes a lower driven pulley 34 and an upper free-spinning pulley 36. The driven pulley 34 is typically driven by a motor (not shown) to selectively raise and lower the seed cable 30 at a desired speed.

An apparatus 80' for weighing single crystals according to this invention, which is described in detail below, is shown disposed in the upper section 16.

Figure 2:
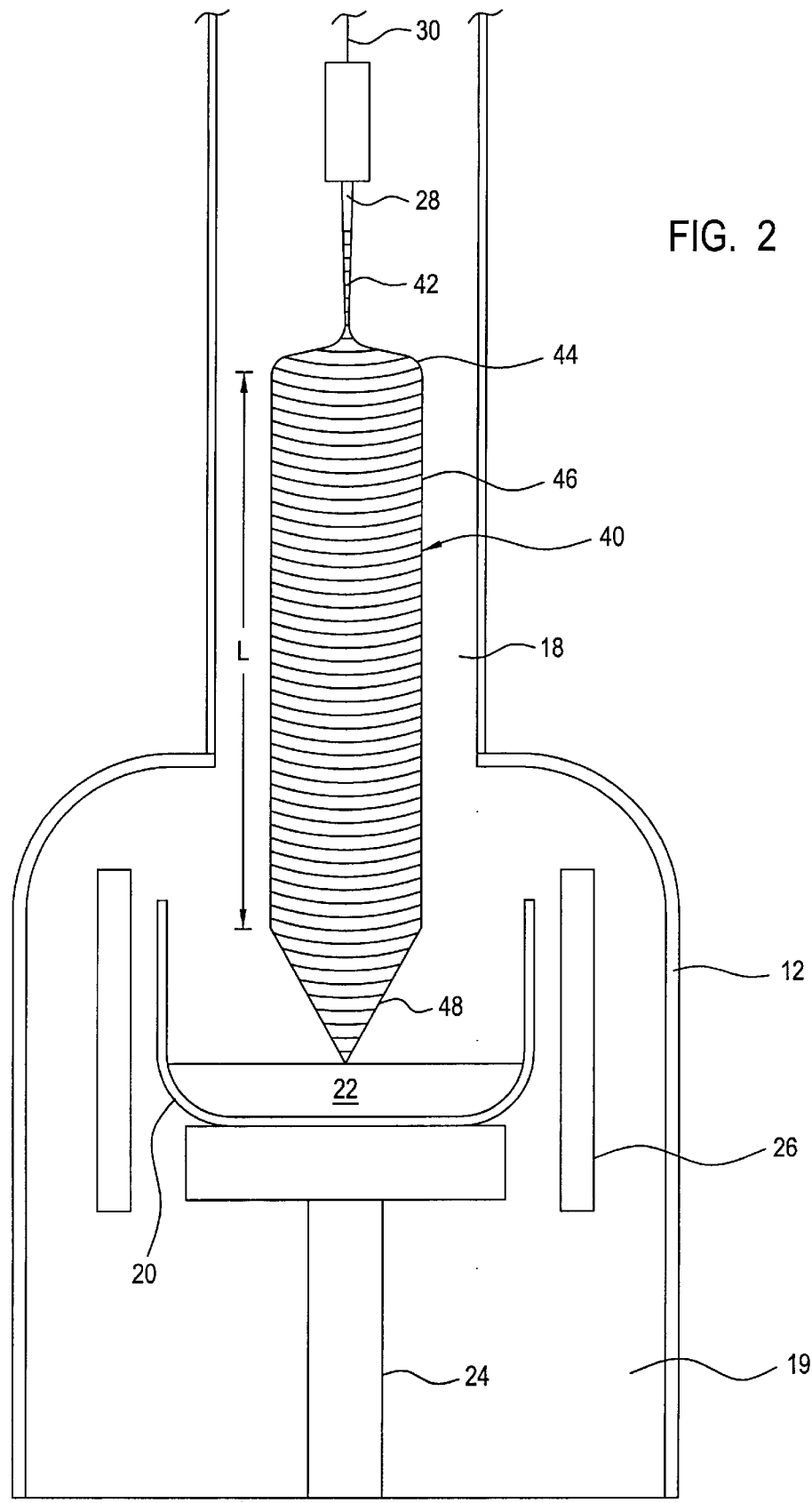
FIG. 2 illustrates a portion of the crystal growing vessel of FIG. 1, showing a single crystal including a tail portion formed too early during crystal growing.

To form a single crystal, the seed crystal 28 is lowered into contact with the melt 22. The single crystal is then raised at a controlled speed while rotating the upper section 16 and seed cable 30 to pull a single crystal of the semiconductor material from the melt 22. A partially formed crystal 38 not having a tail portion is shown in FIG. 1. FIG. 2 shows a fully grown single crystal 40 including a neck portion 42, shoulder portion 44, body portion 46 and a tail portion 48, formed in this respective order. The different portions of the single crystal 40 are formed by controlling the rate at which the seed crystal 28 is pulled from the melt 22, as well as the melt temperature. The single crystal growing process is monitored to determine the progress of the formation of the single crystal 40, to enable determination of the appropriate times during the process to change the crystal pulling conditions to form the different portions of the single crystal 40.

As explained above, the tail portion 48 needs to be properly formed to efficiently utilize semiconductor material, so as to increase the number of wafers that can be formed from single crystals and to reduce the amount of waste single crystal and residual melt remaining in the crucible after crystal growth in completed. In order to form the tail portion 48 properly, the pulling rate and the melt temperature are adjusted at some selected time during crystal growing. It is important that the formation of the tail portion 48 not be started either too early or too late in the crystal growing process, to avoid the above-described problems.

The single crystal 40 shown in FIG. 2 includes a tail portion 48 formed too early during the crystal growing process. The tail portion 48 is properly formed and has a generally conical shape. As shown, however, there is an excessive amount of residual melt 22 in the crucible 20. This residual melt 22 is expensive waste material. Also, because the residual melt 22 does not become a part of the single crystal 40, the body portion 46 may not be properly sized. Typically, the body portion 46 will be not be of the desired length, L, measured from about the bottom of the shoulder portion 44 to the top of the tail portion 48. As a result, the number of wafers that can be formed by slicing the body portion 46 along its length following finishing of the crystal 40 will be reduced.

Figure 3:
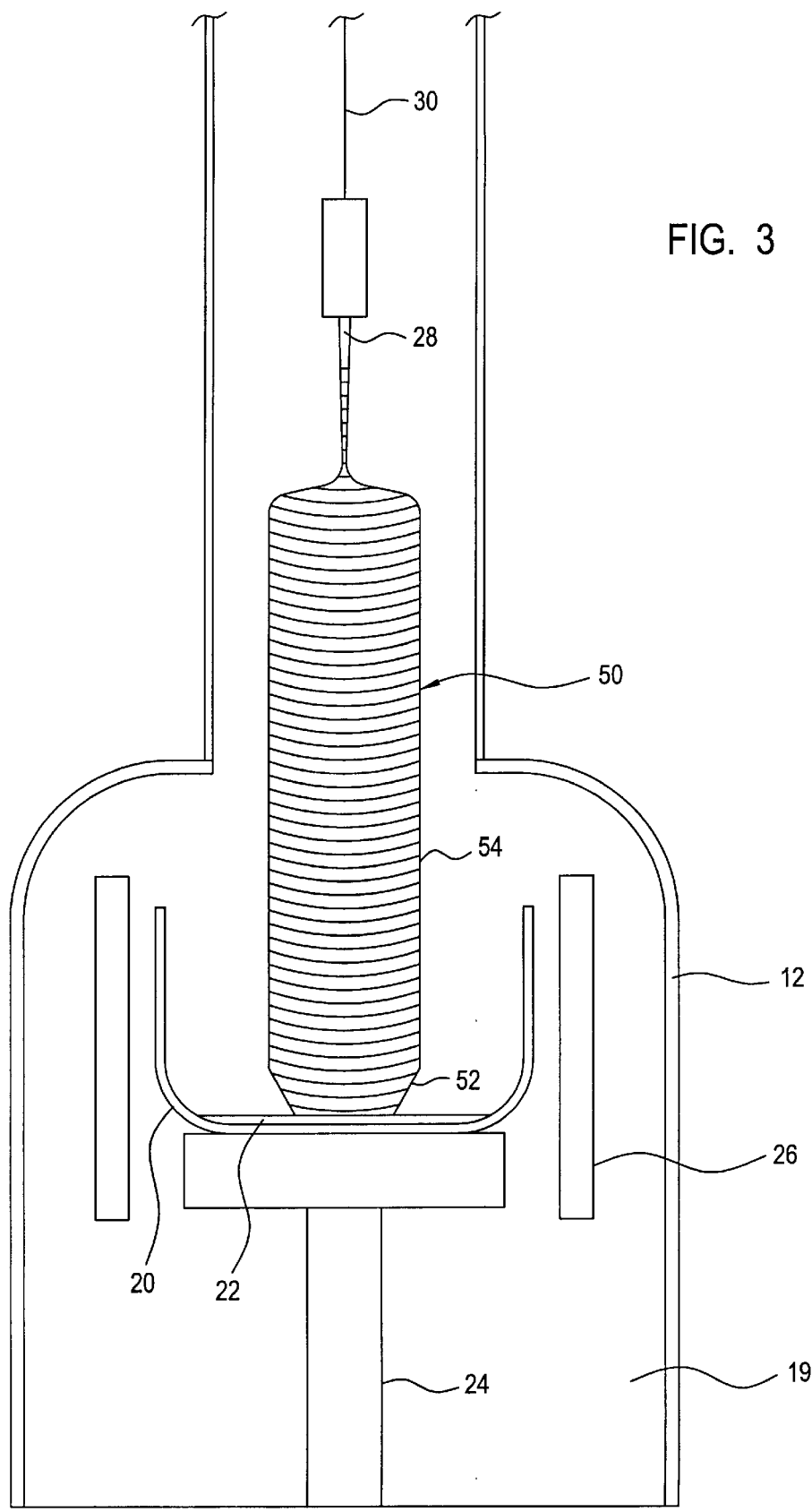
FIG. 3 illustrates a portion of the crystal growing vessel of FIG. 1, showing a single crystal including a tail portion formed too late during crystal growing.

FIG. 3 shows a single crystal 50 having a tail portion 52 started too late during crystal growing. As shown, the tail portion 52 is only partially formed and does not have the conical configuration of the fully formed tail portion 48 depicted in FIG. 2. In this case, substantially all of the melt 22 in the crucible 20 goes into the crystal 50 before the tail portion 52 is completed. Because the tail portion 52 is not fully formed, it is typically necessary to remove a greater than normal volume of crystal material from the lower part of the body portion 54 (adjacent to the tail portion 52), to remove crystal that has poor crystal lattice structure and corresponding poor electrical properties. Removal of this crystal material causes waste of expensive semiconductor material and a reduction in the number of wafers that can be formed from the body portion 54 after finishing. Accordingly, starting the formation of the tail portion 52 too late is also undesirable.

This invention provides an apparatus for weighing Czochralski single crystals during crystal growth to enable the progress of the crystal growing process to be determined more accurately than in known apparatuses. The apparatus can accurately determine the weight of grown single crystals to allow process conditions (crystal pulling speed and/or melt temperature) to be changed at appropriate times during the crystal growing process to properly form the different portions of single crystals and, particularly, the body portion and tail portion. The apparatus can accurately determine single crystal weights under different pressure conditions, including vacuum conditions, existing in single crystal growing vessels.

The problems associated with accurately determining the weight of grown crystals during crystal growing processes, under different pressure conditions, will be explained with reference to FIG. 4, which illustrates a known apparatus 60 for weighing crystals disposed in the upper section 16 of the single crystal growing vessel 10 shown in FIG. 1. The apparatus 60 comprises a cantilevered beam 64 having a first end 66 supported by an upstanding support 68, and an opposed second end 70.

The lift 32 is attached to the beam 64 between the first end 66 and the second end 70. During single crystal growth, the weight of the single crystal (not shown) raised by the seed cable 30 increases. The weight of the single crystal is transmitted to the beam 64 via the seed cable 30 and the lift 32. As the weight of the single crystal increases, the load applied to the beam 64 by the lift also increases. The weight of the single crystal is transmitted by the seed cable 30 to the free-spinning pulley 36, which in turn transmits this load to the beam 64. This load causes the second end 70 of the beam 64 to deflect in a clockwise direction CW.

In order to determine the magnitude of the load applied to the beam 64 by the single crystal, the apparatus 60 typically comprises a load transmitting element 72, typically proximate to the second end 70 of the beam 64, and a load sensor 74 mounted to a wall 17 of the upper section 16 below the load transmitting element 72. The load transmitting element 72 contacts the load sensor 74 during crystal pulling, and exerts a load on the load sensor 74 that is measured and converted to an apparent weight of the grown single crystal.

As shown, the load transmitting element 72 on the beam 64 is cone shaped to mate with a cup shaped depression in the contact element 76 of the load sensor 74. As the weight of the crystal increases during crystal growth, the load transmitting element 72 exerts an increasing load on the load sensor 74. The load sensor 74 of this apparatus 60 does not accurately determine grown crystal weight, however, due to the presence of forces, in addition to the force corresponding to the weight of the single crystal, that are also exerted on the load sensor 74.

Particularly, when the pressure within the upper section 16 of the single crystal growing vessel 10 is maintained at a low pressure such as vacuum pressure, external, atmospheric pressure P acting on the bottom wall 17 of the upper section 16, can cause the bottom wall 17 to deflect slightly upward. Temperature differences between the interior of the crystal growing vessel 10 and the external atmosphere can also contribute to this effect on the bottom wall 17. Consequently, forces H acting generally horizontally (as opposed to the generally vertically acting force W of the weight of the crystal) also act between the respective contact surfaces C of the load transmitting element 72 and the contact element 76 of the load sensor 74. Due to the respective shapes of the contact surfaces, horizontal movement of the load transmitting element 72 relative to the contact element 76 is constrained. That is, the cone shaped load transmitting element 72 is firmly seated in the cup shaped contact surface of the contact element 76. This constraint increases as the weight of the single crystal increases. Consequently, the forces H contribute to the total force exerted on the contact element 76 of the load sensor 74. As a result, the load sensor 74 senses the force associated with the actual weight of the grown crystal, but also simultaneously senses the forces H caused by the pressure acting on the bottom wall 17 of the upper section 16. Thus, the load sensor 74 can sense a total force significantly different from the force associated with the weight of the crystal alone. Consequently, the apparatus 60 does not provide an accurate measure of the weight of grown crystal, and determines weights that are either too high or too low.

As explained above, it is important to accurately determine the grown crystal weight in order to complete the formation of the body portion and the initiation of the tail portion of the crystal at the correct time during crystal growing. Otherwise, the tail portion will be either started too early or too late, resulting in the problems discussed above. If the weight of grown crystal according to the load sensor 74 is too high, then the tail portion can be started too early. If the weight of grown crystal according to the load sensor is too low, the tail portion can be started too late.

Figure 4:
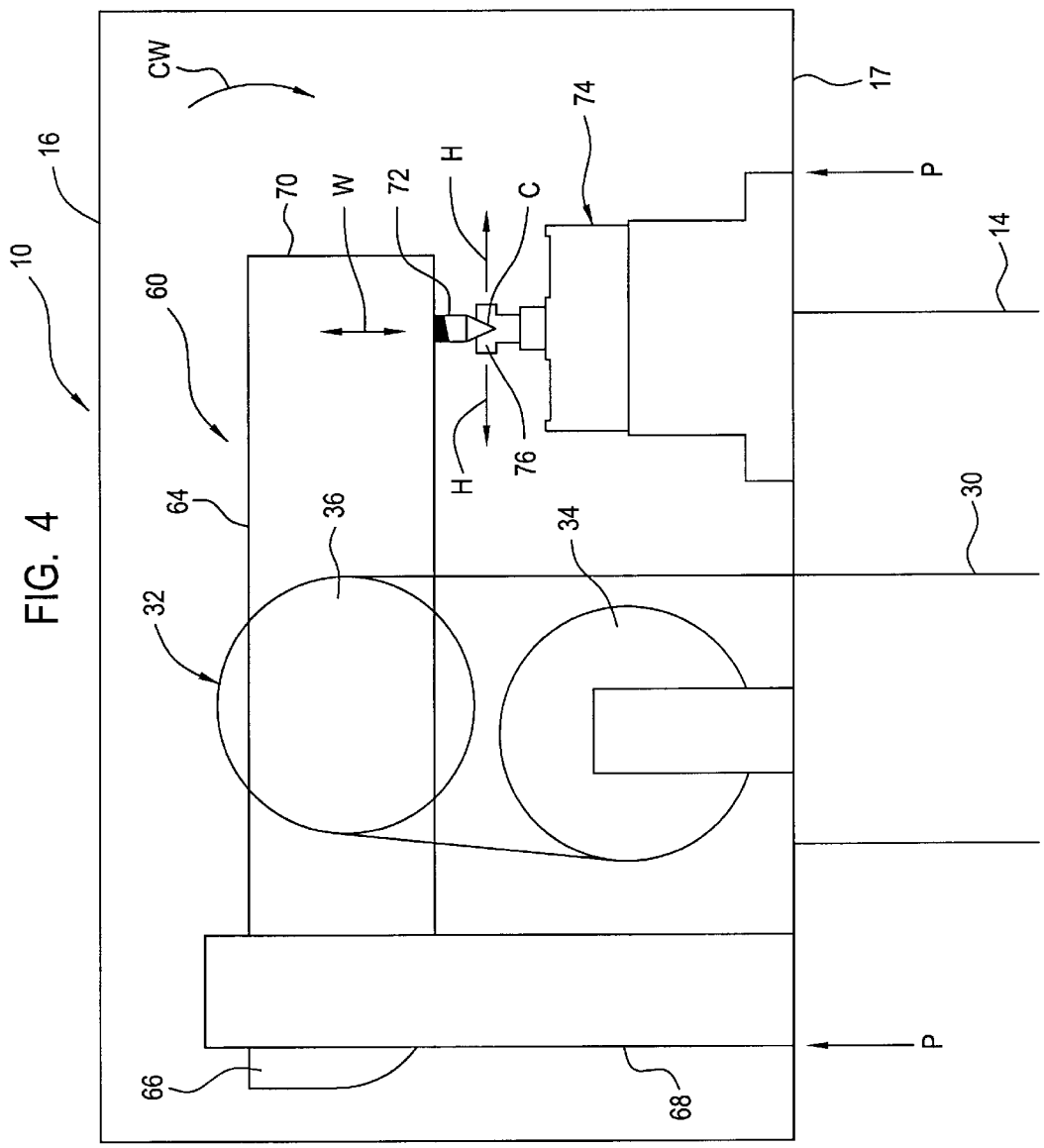
FIG. 4 illustrates a known single crystal weighing apparatus.
Figure 5:
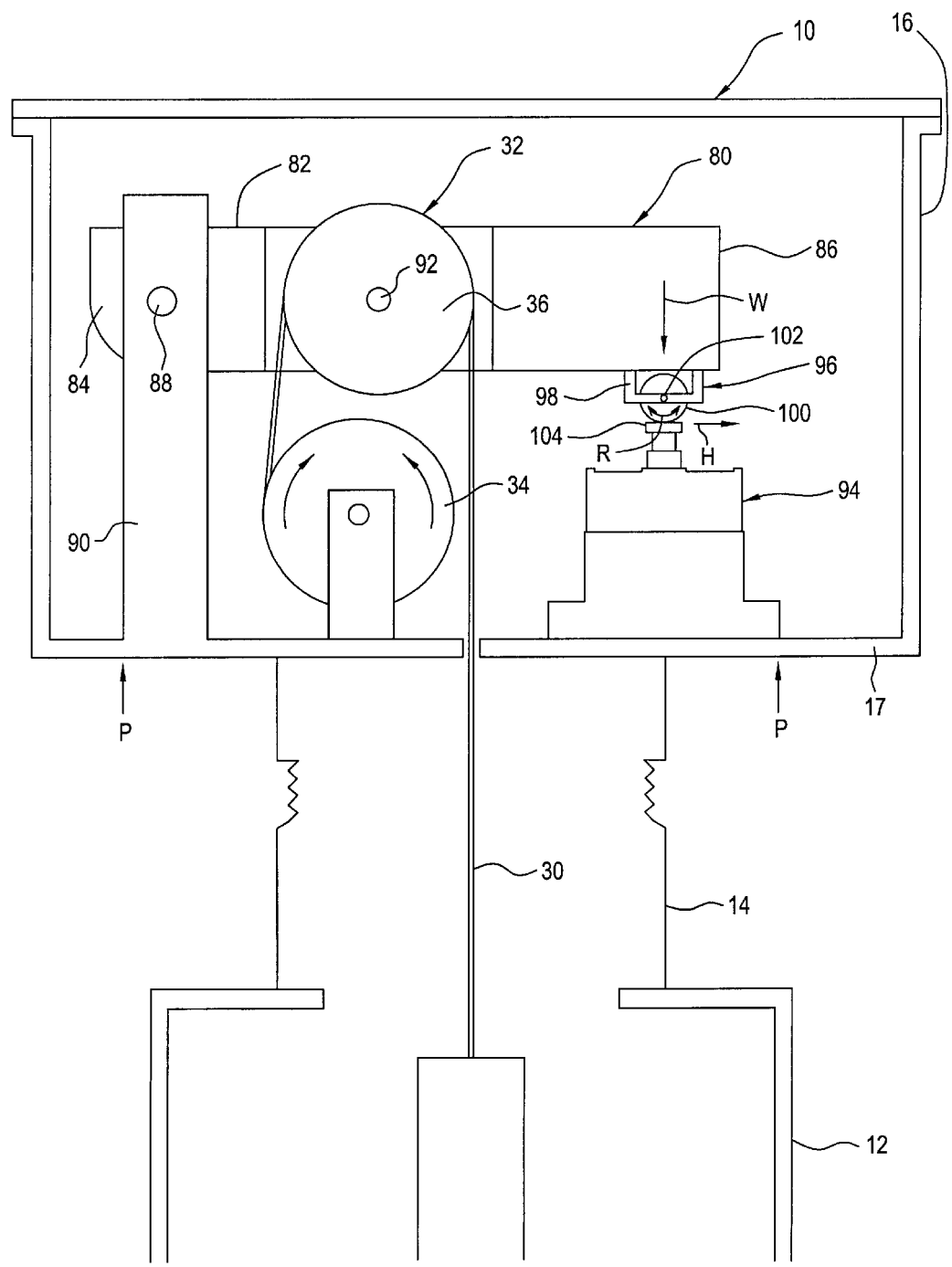
FIG. 5 is an enlarged partial view of the crystal growing vessel of FIG. 1, showing an apparatus for weighing Czochralski single crystals during crystal growth according to an embodiment of this invention.

The apparatus according to embodiments of this invention can more accurately measure the weight of grown crystal during crystal growing processes as compared to known apparatuses such as shown in FIG. 4. An embodiment of an apparatus according to this invention is shown in FIG. 5. The apparatus 80 comprises an elongated member having a first end 84 and an opposed second end 86. The elongated member is typically a cantilevered beam 82 as shown. The elongated member can alternatively be formed, for example, from other types of beams, bars, rods or combinations of elongated members, such as two or more beams. The cross-sectional shape of the elongated member can be varied as well.

The first end 84 of the beam 82 is pivotally supported about an axis 88 by an upstanding support 90 mounted to the wall 17 of the upper section 16. The location of the axis 88 can be selectively varied longitudinally or vertically along the beam 82 between the first end 84 and the lift 32.

The lift 32 is attached to the beam 82 at a location between the first end 84 and the second end 86. During single crystal growth, the weight of the single crystal is transmitted to the beam 82 via the lift 32. As the weight of the single crystal increases, the vertically acting load applied to the beam 82 by the lift 32 increases also. When the apparatus 80 is used in combination with a lift 32 such as shown, the free-spinning pulley 36 can be pivotally attached to the beam 82 about a pivot axis 92. For example, a pivot shaft of the pulley 36 can be mounted to the beam 82 so that the pulley 36 rotates about the pivot shaft during operation of the lift 32. The pulley 36 is typically mounted to the beam 82 at about the center of the beam 82. This mounting location can be varied, however, either longitudinally and/or vertically along the beam 82, so long as the lift 32 is disposed between the first and second ends of the beam 82. The weight of the single crystal is transmitted by the seed cable 30 to the pulley 36, which in turn transmits this load to the beam 82. This load is transmitted at the second end 86 of the beam 82 to a load sensor 94 mounted to the bottom wall 17. The load sensor 94 determines the weight of grown crystal.

It will also be understood by those skilled in the art that the apparatus 80 and other embodiments of this invention can be used in combination with lifts having different constructions than the lift 32 shown in FIGS. 1 and 2. For example, the lift can have other pulley configurations.

A load transmitting element 96 is provided on the beam 82 to interact with the load sensor 94. The load transmitting element 96 is typically provided proximate to the second end 86 of the beam 82. The load transmitting element 96 contacts the load sensor 94 during crystal pulling, and exerts a load on the load sensor 94 that is measured and converted to the weight of the single crystal grown.

As shown, the load transmitting element 96 can include a housing 98 attached to the beam 82 and a contact element 100 attached to the housing 98. The contact element 100 is preferably a rolling element such as shown, for reasons explained below. For example, the rolling element can be a wheel, roller bearing or the like. The contact element 100 rotates freely about an axis 102 as depicted by arrow R.

The load sensor 94 can be, for example, a load cell such as a piezoelectric device, a strain gauge device or the like, capable of determining the weight of the grown crystal based on the load applied by the load transmitting element 96. The load sensor 94 can include a load bearing surface 104, which is typically a flat, upper surface.

Typically, the contact element 100 contacts the load bearing surface 104 at the beginning of the crystal growing process. The load applied to the load bearing surface 104 at this point is typically used as a baseline value. This load includes the loads associated with the weight of the beam 82, the weight of the lift 32 applied on the beam 82, and the weight of the seed crystal 28, exerted on the load sensor 94 before the single crystal is formed. During single crystal growth, the increasing weight of the single crystal causes the contact element 100 to exert an increasing load on the load bearing surface 104. When the contact element 100 is a rolling element as shown, due to their respective shapes, the contact element 100 can roll substantially unconstrained over the load bearing surface 104 during this contact. The contact element 100 preferably rolls linearly over the load bearing surface 104. This substantially unconstrained rolling movement reduces forces, such as horizontal forces H, between the contact element 100 and the load sensor 94, other than those directly related to the weight of the single crystal. Substantially the only horizontal forces H acting between the contact element 100 and the load bearing surface 104 are tangential forces acting along the direction of a tangent at the contact point between the contact element 100 and the load bearing surface 104. As a result, the load W associated with the single crystal that is transmitted to the beam 82, acts vertically, substantially perpendicular to the load bearing surface 104, and horizontal (tangential) forces H on the load bearing surface 104 are substantially eliminated. Accordingly, the load sensor 94 can provide an accurate measure of the weight of single crystals because horizontal loads that act in addition to the perpendicular crystal weight-related component of the load are reduced.

To further reduce such horizontal loads on the load bearing surface 104 of the load sensor 94, the load bearing surface 104 and the contact surface of the load transmitting element 96 can be smooth to reduce friction effects. For example, the load bearing surface 104 and contact surface of the contact element 100 can be polished metal surfaces. These surfaces can be formed of various metals, polymers and other materials that have suitable wear resistance to withstand the loads associated with the weight of single crystals. Friction-reducing substances such as solid or liquid lubricants can also be used to reduce frictional forces.

Figure 6:
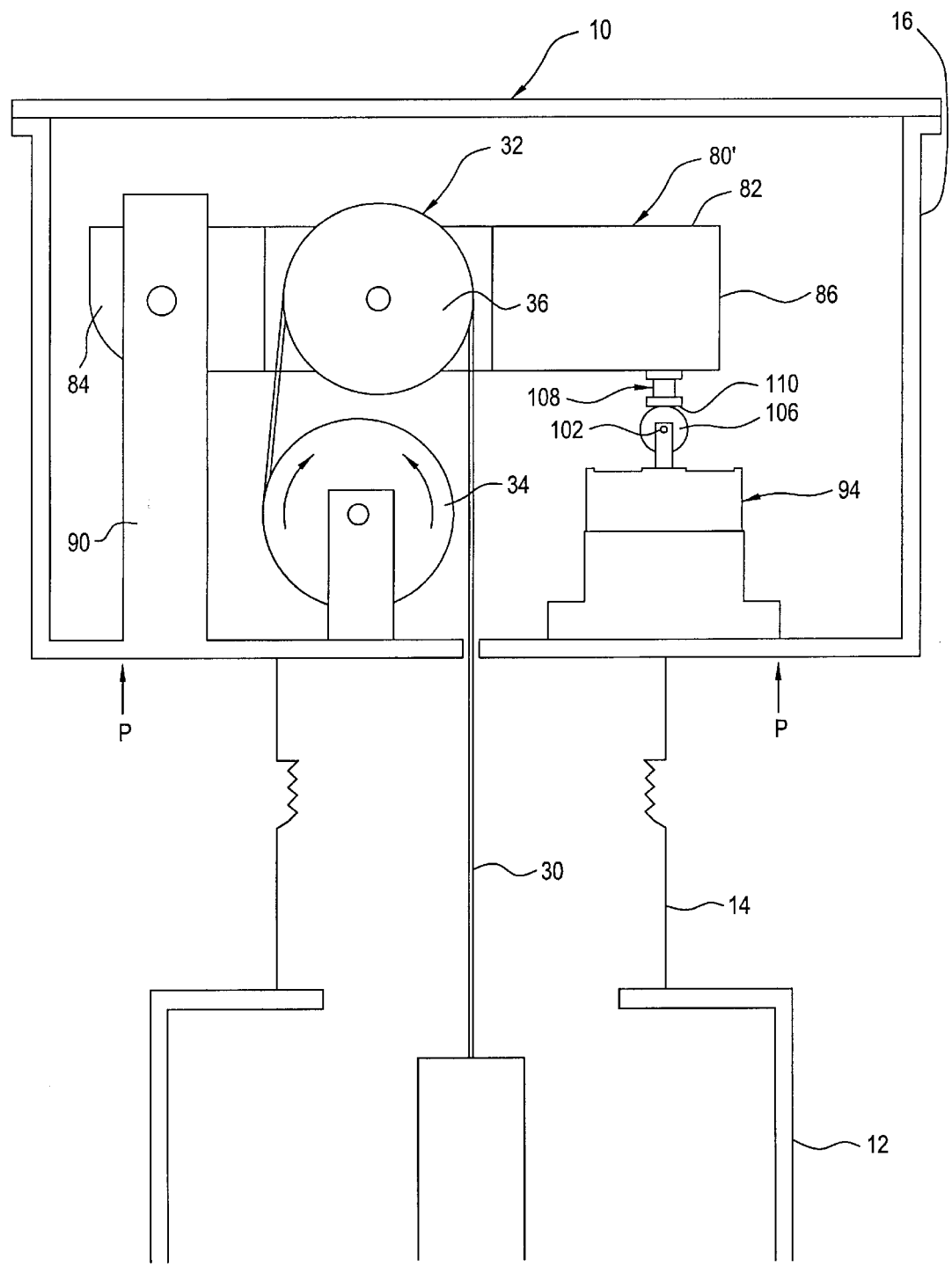
FIG. 6 is an enlarged partial view of the crystal growing vessel of FIG. 1, including an apparatus for weighing Czochralski single crystals during crystal growth according to another embodiment of this invention.

According to another embodiment 80' of this invention illustrated in FIG. 6, a rolling contact element 106 can alternatively be mounted on the load sensor 94, and the load transmitting element 108 mounted on the beam 82 can have a flat contact surface 110 over which the contact element 106 rolls substantially unconstrained during crystal growing.

It will be understood by those skilled in the art that the shapes of the surfaces of the load transmitting element and the load sensor that contact each other during crystal growing can be varied to provide substantially unconstrained relative movement between the surfaces. For example, both surfaces can be circular shaped. Other shapes can also be used that substantially do no constrain horizontal movement of the load transmitting element relative to the load sensor during crystal growth, to reduce undesirable effects on measurement accuracy caused by horizontal loading of the load sensor.

Thus, this invention provides apparatuses that can more accurately determine grown crystal weight during crystal growing, under different pressure conditions in crystal growing vessels, than is possible in known apparatuses. Consequently, this invention can more accurately determine the proper time during crystal growing to change crystal growing conditions to form different portions of single crystals. The apparatus can be used to grow single crystals having properly formed body and tail portions, so as to more efficiently utilize semiconductor material. Thus, semiconductor material waste can be reduced. In addition, single crystals formed using the apparatus can provide an increased number of semiconductor wafers due to the reduced amount of body portion material that needs to be removed due to poor crystal structure and electrical properties. The apparatus can also reduce the amount of residual melt.

While this invention has been described in conjunction with the specific embodiments described above, it is evident that many alternatives, modifications and variations are apparent to those skilled in the art. Accordingly, the preferred embodiments of this invention as set forth above are intended to be illustrative and not limiting. Various changes can be made without departing from the spirit and scope of this invention as defined in the following claims.

What is claimed is:

1. An apparatus for weighing Czochralski single crystals during crystal growth in a crystal growing vessel, the crystal growing vessel including a chamber, a crucible for containing a melt of a semiconductor material in the chamber, and a lift for raising a seed crystal in contact with the melt to pull a single crystal, the apparatus comprising:

an elongated member having a first end and a second end opposite to the first end, the elongated member being attachable to the lift at a location between the first and second ends;

a first contact surface on the elongated member; and a second contact surface; and a load sensor operatively associated with at least one of the first and second contact surfaces;

wherein the first and second contact surfaces are respectively shaped such that the first contact surface contacts and can move substantially horizontally over the second contact surface without substantial horizontal constraint by the second contact surface during pulling of the single crystal from the melt, and the first contact surface exerts a substantially vertical force on the second contact surface that is sensed by the load sensor and that corresponds substantially to the weight of the single crystal that has grown during pulling.

2. The apparatus of claim 1, further comprising a rolling element mounted to the elongated member and including the first contact surface, the second contact surface being a substantially flat surface of the load sensor, and wherein the first contact surface rolls over the second contact surface during pulling of the single crystal.

3. The apparatus of claim 1, further comprising a rolling element mounted to the load sensor and including the second contact surface, the first contact surface being a substantially flat surface on the elongated element, and wherein the second contact surface rolls over the first contact surface during pulling of the single crystal.

4. The apparatus of claim 1, wherein at least one of the first and second contact surfaces is a smooth surface which reduces frictional forces between the first and second contact surfaces during crystal pulling.

5. The apparatus of claim 1, wherein the chamber of the crystal growing vessel is maintained at a pressure lower than a pressure outside of the crystal growing vessel that acts on a wall of the crystal growing vessel to which the elongated member and load sensor are mountable.

6. The apparatus of claim 1, wherein the load sensor comprises a load cell.

7. The apparatus of claim 1, further comprising a lubricant between the first and second contact surfaces which reduces frictional forces.

8. The apparatus of claim 1, comprising only one load sensor.

9. An apparatus for weighing Czochralski single crystals during crystal growth in a crystal growing vessel, the crystal growing vessel including a chamber, a crucible for containing a melt of a semiconductor material in the chamber, and a lift for raising a seed crystal in contact with the melt to pull a single crystal, the apparatus comprising:

a cantilevered beam having a first end pivotally mountable to a support and a second end opposite to the first end, the cantilevered beam being attachable to the lift at a location between the first and second ends, and the cantilevered beam including a first contact surface between the lift and the second end;

a second contact surface; and a load sensor operatively associated with at least one of the first and second contact surfaces;

wherein at least one of the first and second contact surfaces is a rolling surface;

wherein the first contact surface contacts and can move horizontally relative to the second contact surface without substantial horizontal constraint by the second contact surface during pulling of the single crystal from the melt, and the first contact surface exerts a substantially vertical force on the second contact surface that is sensed by the load sensor and corresponds substantially to the weight of the single crystal that has grown during pulling.

10. The apparatus of claim 9, further comprising a rolling element mounted to the cantilevered beam between the lift and the second end, the rolling element including the rolling surface, the second contact surface being a substantially flat surface of the load sensor, and wherein the rolling element rolls over the second contact surface during pulling of the single crystal.

11. The apparatus of claim 9, further comprising a rolling element mounted to the load sensor and including the rolling surface, the first contact surface is a substantially flat surface on the cantilevered beam, and wherein the rolling element rolls relative to the first contact surface during pulling of the single crystal.

12. The apparatus of claim 9, wherein at least one of the first and second contact surfaces is a smooth surface which reduces frictional forces between the first and second contact surfaces during crystal pulling.

13. The apparatus of claim 9, wherein the chamber of the crystal growing vessel is maintained at a pressure lower than a pressure outside of the crystal growing vessel during acts on a wall of the crystal growing vessel to which the elongated member and load sensor are mountable.

14. The apparatus of claim 9, wherein the load sensor comprises a load cell.

15. The apparatus of claim 9, further comprising a lubricant between the first and second contact surfaces which reduces frictional forces.

16. A crystal growing vessel for growing single crystal by the Czochralski growing technique, comprising:

a chamber;

a crucible containing a melt of a semiconductor material disposed in the chamber;

a lift disposed above the crucible for raising a seed crystal in contact with the melt to pull a single crystal; and an apparatus for weighing Czochralski single crystals during crystal growing in the crystal growing vessel, including:

an elongated member having a first end and a second end opposite to the first end, the elongated member being attached to the lift between the first and second ends;

a first contact surface on the elongated member;

a second contact surface; and a load sensor operatively associated with at least one of the first and second contact surfaces;

wherein the first and second contact surfaces are respectively shaped such that the first contact surface contacts and can move substantially horizontally relative to the second contact surface without substantial horizontal constraint by the second contact surface during pulling of the single crystal from the melt, and the first contact surface exerts a substantially vertical force on the second contact surface that is sensed by the load sensor and that corresponds substantially to the weight of the single crystal that has grown during pulling.

17. The crystal growing vessel of claim 16, wherein the apparatus further comprises a rolling element mounted to the elongated member and including the first contact surface, the second contact surface being a substantially flat surface of the load sensor, and wherein the rolling element can roll substantially unconstrained over the second contact surface during pulling of the single crystal.

18. The crystal growing vessel of claim 16, wherein the apparatus further comprises a rolling element mounted to the load sensor and including the second contact surface, the first contact surface being a substantially flat surface on the elongated element, and wherein the rolling element can move substantially unconstrained relative to the first contact surface during pulling of the single crystal.

19. The crystal growing vessel of claim 16, wherein at least one of the first and second contact surfaces is a smooth surface which reduces frictional forces between the first and second contact surfaces during crystal pulling.

20. The crystal growing vessel of claim 16, wherein the crystal growing vessel includes a wall to which the apparatus is mounted, and the chamber is maintained at a pressure lower than a pressure outside of the crystal growing vessel that acts on the wall.

21. The crystal growing vessel of claim 16, wherein the load sensor comprises a load cell.

22. The crystal growing vessel of claim 16, further comprising a lubricant between the first and second contact surfaces which reduces frictional forces.

23. The apparatus of claim 16, comprising only one load sensor.

* * * * *